(12) United States Patent
Zheng et al.

(10) Patent No.: US 7,486,548 B2
(45) Date of Patent: Feb. 3, 2009

(54) MAGNETIC MEMORY DEVICE

(75) Inventors: Yuankai Zheng, Singapore (SG); Yihong Wu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 241 days.

(21) Appl. No.: 10/553,223

(22) PCT Filed: Apr. 16, 2003

(86) PCT No.: PCT/SG03/00088

§ 371 (c)(1), (2), (4) Date: May 1, 2006

(87) PCT Pub. No.: WO2004/093087

PCT Pub. Date: Oct. 28, 2004

(65) Prior Publication Data

US 2006/0250840 A1 Nov. 9, 2006

(51) Int. Cl.
G11C 11/14 (2006.01)
(52) U.S. Cl. .................. 365/171; 365/158; 365/173
(58) Field of Classification Search ................. 365/158, 365/171, 173
See application file for complete search history.

(56) References Cited

U.S. PATENT DOCUMENTS

| 5,930,164 | A | 7/1999 | Zhu |
| 5,966,323 | A | 10/1999 | Chen et al. |
| 6,166,948 | A * | 12/2000 | Parkin et al. ................. 365/173 |
| 6,404,674 | B1 * | 6/2002 | Anthony et al. ............. 365/173 |
| 6,473,328 | B1 | 10/2002 | Mercaldi |
| 6,765,823 | B1 * | 7/2004 | Zhu et al. .................... 365/173 |

FOREIGN PATENT DOCUMENTS

WO 01/71735 9/2001

OTHER PUBLICATIONS

Austrian Patent Office Examination Report mailed Dec. 22, 2006 for corresponding Singapore Patent Application 200506516-4.

* cited by examiner

Primary Examiner—Gene N. Auduong
(74) Attorney, Agent, or Firm—Renner, Otto, Boisselle & Sklar, LLP

(57) ABSTRACT

A memory cell for a magnetic memory device comprising a first hard magnetic later having a first fixed magnetization vector; a second hard magnetic later having a second fixed magnetization vector; a first soft magnetic layer having a first alterable magnetization vector and disposed adjacent to the first hard magnetic layer and a second soft magnetic layer having a second alterable magnetization vector and disposed adjacent to the second hard magnetic layer, the first and the second soft magnetic layers are magnetostatically coupled antiparallel to each other to form a flux-closed structure. An electrically conductive layer is disposed between the two soft magnetic layers for passing an electric current therethrough to perform the read and write operations. A magnetic memory device made thereof possesses a higher thermal stability against external thermal fluctuations and in the meantime has a lower power dissipation in writing operations.

18 Claims, 7 Drawing Sheets

MAGNETIC MEMORY DEVICE

FIELD OF THE INVENTION

The present invention relates to a magnetic memory device. In particular, it relates to a spin-valve magnetoresistive random access memory device.

BACKGROUND OF THE INVENTION

Magnetoresistive random access memory (MRAM) devices are solid state, non-volatile memory devices. A conventional MRAM device includes a column of first electrical wires (referred to as "word lines") and a row of second electrical wires (referred to as "bit lines"). An array of magnetic memory cells are located at the junctions of the word lines and bit lines is used to record data signals.

A typical MRAM cell comprises a hard magnetic layer, a soft magnetic layer and a non-magnetic layer sandwiched between the hard magnetic layer and the soft magnetic layer. The hard magnetic layer has its magnetization vector fixed in one direction. The orientation of the fixed magnetization vectors does not change under a magnetic field applied thereon. The soft magnetic layer has an alterable magnetization vector, under a magnetic field applied thereon, that either points to the same direction (hereinafter "parallel" alignment) or opposite direction (hereinafter "antiparallel" alignment) of the magnetization vector of the hard magnetic layer. Since the resistances of the memory cell in the "parallel alignment" status and the "antiparallel alignment" status are different, the two types of alignment status can be used to record the two logical states—the "0"s or "1"s of a data bit.

In a writing operation, an electric current passes through the word line and the bit line adjacent to the memory cell. When the electric current reaches a certain threshold, the magnetic field generated by the electric currents will switch the orientation of the magnetization vector of the soft magnetic layer. As a result, the magnetization of the hard magnetic layer and the soft magnetic layer will be changed from one type of alignment (e.g. "parallel alignment") to the other type of alignment (e.g. "antiparallel alignment"), so that a data signal can be recorded in the memory cell.

As shown in FIG. 1A, a conventional spin-valve MRAM device 100 comprises a plurality of memory cells 110, a row of bit lines 120 passing through the memory cells 110 and a column of word lines 130 passing underneath the memory cells 110. An exemplary cell 110 shown in FIG. 1B comprises a first magnetic layer 112, a non-magnetic layer 114, a second magnetic layer 116 and an antiferromagnetic layer 118. The first magnetic layer 112 is formed of ferromagnetic material such as CoFe and/or NiFe. The non-magnetic layer 114 is formed of non-magnetic material such as Cu. The second magnetic layer 116 is formed of ferromagnetic material such as CoFe and/or NiFe, and the antiferromagnetic layer 18 is formed of antiferromagnetic material such as IrMn, FeMn and/or PtMn, etc.

The above layers are disposed in sequence as shown in FIG. 1B. The second magnetic layer 116 (hereinafter "pinned layer") has a fixed or "pinned" magnetization vector 116a pointing rightward, for example, which does not change its direction under a magnetic field applied thereon. The antimagnetic layer 118 serves to fix the magnetization of the second magnetic layer 116.

The first magnetic layer 112 has a magnetization vector 112a that is alterable under a magnetic field applied thereon. During a writing process, a word line current 132 passing underneath the cell 110 and a bit line current 122 passing through the cell 110 generate a magnetic field on the first magnetic layer 112. When the magnetic field reach the switching threshold of the first magnetic layer 112, the orientation of the magnetization vector 112a of the first magnetic layer 112 will be changed from pointing leftward to pointing rightward. With the orientation change, the magnetization vector 112a becomes parallel to the magnetization vector 116a, which represents a low magnetic resistance state of the cell 110. When the word line current 132 and the bit line current 122 flow in a direction opposite to that of the example above, the magnetization vector 112a will be changed to become anti-parallel to the magnetization vector 116a. This represents a high magnetic resistance state of the cell 110. The "low" and "high" states correspond to binary data bits "0" and "1" by which a data signal may be stored in the memory cell. The signal may be read or detected when a "read" current passes through the bit line.

One problem encountered in this type of memory cell is that the second magnetic layer 116 generates a static field and applies on the first magnetic layer 12, which tends to disrupt the stability of the magnetization of the first magnetic layer 112. As the dimensions of the memory cells are decreased to achieve a higher data storage capacity, this static field effect will only become more significant.

For example, when the dimensions of the memory cells shrink, external thermal fluctuations will cause the magnetization vector of the first magnetic layer 112 to rotate, which may cause data recording errors. Another problem encountered in this type of memory cell is that with the size of the memory cells scaled down, there generates a large edge domain in the first magnetic layer 112, which also contributes to the thermal unstability of the memory device.

Various solutions have been developed to address the above problems. In "Spin Valve Sensors With Synthetic Free and Pinned Layers" to Anabela et al (J. Appl. Phys. Vol 87, Num. 9, 5744, 2000), a spin-valve memory element comprising synthetic layers is disclosed. The synthetic layers are used to eliminate the interlayer magnetostatic coupling, decrease pinned layer demagnetizing field and reduce the effective thickness of the free layer, as shown schematically in FIG. 2.

The memory element 200 comprises a synthetic ferrimagnetic free layer 210 having an alterable effective magnetization vector 210a, a non-magnetic layer 220 disposed above the free layer 210, a pinned layer 230 and an antiferromagnetic layer 240. The pinned layer 230 further includes three sub-layers 232, 234 and 236, and the free layer 210 further includes three sub-layers 212, 214 and 216.

In this structure, the ferromagnetic sub-layer 232 and 236 are antiferromagnetically coupled to each other through a non-magnetic layer 234, and the ferromagnetic sub-layer 212 and 216 are antiferromagnetically coupled to each other through a non-magnetic layer 214. The magnetization of the ferromagnetic sub-layer 236 is configured anti-parallel to that of the first ferromagnetic sub-layer 232, therefore the static field generated by the pinned layer 230 and applied onto the free layer 210 can be reduced. In addition, as the magnetization of the ferromagnetic sub-layer 212 is anti-parallely aligned with that of the ferromagnetic sub-layer 216, the effective thickness of free layer 30 can be reduced.

While the thermal stability may be increased in this type of memory device, another problem arises as since the synthetic ferromagnetic layers required a larger writing current to perform the writing operation, the power dissipation of this type of device increases.

U.S. Pat. No. 6,358,757 to Anthony et al discloses a method for forming a magnetic memory with a set of structures that prevent disruptions to the magnetization in the free layer of a magnetic memory cell. The structure includes a high permeability magnetic film that serves as a keeper for the sense layer magnetization. In this structure, however, the large edge domain effect which contributes to the thermal instability of the device, remain unsolved.

It is therefore desirable to provide a magnetic memory device having a higher resistance against thermal fluctuations so that to improve the thermal stability and reduce the edge domain effect. While maintaining a high thermal stability, there is in the meantime a need to have a magnetic memory device having a higher sensitivity in response to the writing current, so that to reduce the overall power dissipation.

SUMMARY OF THE INVENTION

In accordance with a first aspect of the present invention, there is provided a memory cell for a magnetic memory device, the memory cell comprises a first hard magnetic layer, a second hard magnetic layer, a first soft magnetic layer and a second soft magnetic layer. The two soft magnetic layers are respectively disposed adjacent to the two hard magnetic layers. Each of the two hard magnetic layers has a fixed magnetization vector, and the two magnetization vectors are anti-parallelly aligned with each other. Each of the two soft magnetic layers has an alterable magnetization vector and the two magnetization vectors are anti-parallely aligned with each other, wherein the two soft magnetic layers are magnetostatically coupled to each other to form a flux-closed structure.

Preferably, the two hard magnetic layers are disposed between the two soft magnetic layers. Alternatively, the two soft magnetic layers are disposed between the two hard magnetic layers.

Preferably, the memory cell further comprises an antiferromagnetic layer disposed adjacent to one of the first and the second hard magnetic layers to fix the orientation of the magnetization vector therein. More preferably, the memory cell further comprises an assistant magnetic layer disposed adjacent to one of the first and the second hard magnetic layers, the assistant magnetic layer has a magnetization vector anti-parallelly aligned with one of the first and the second hard magnetic layers to reduce the static magnetic field thereof.

In accordance with a second aspect of the present invention, there is provided a memory cell for a magnetic memory device, the memory cell comprises a first hard magnetic layer, a second hard magnetic layer, a first soft magnetic layer disposed adjacent to the first hard magnetic layer, and a second soft magnetic layer disposed adjacent to the second hard magnetic layer. The first hard magnetic layer has a first fixed magnetization vector, the second hard magnetic layer has a second fixed magnetization vector, the first soft magnetic layer has a first alterable magnetization vector which direction is alterable under a magnetic field applied thereon, and the second soft magnetic layer has a second alterable magnetization vector which direction is alterable under a magnetic field applied thereon. The memory cell allows an electric current to pass through in a first direction, and at least one of the first fixed magnetization vector and the second fixed magnetization vector is oriented oblique with respect to the first direction of the electric current.

In accordance with a third aspect of the present invention, there is provided a magnetic memory device formed of a plurality or an array of the memory cells as according to the first and/or second aspect of the present invention.

In one embodiment, the magnetic memory device comprises an electrically conductive line coupled to the plurality of memory cells, and in a further embodiment, the magnetic memory device comprises a plurality of gate members each coupled to the plurality of memory cells through the electrically conductive line for controllably supplying an electric current to the respective memory cell through the electrically conductive line to perform a reading or writing operation.

DETAILED DESCRIPTION OF THE PREFERRED EMBODIMENTS

Figure 1A:
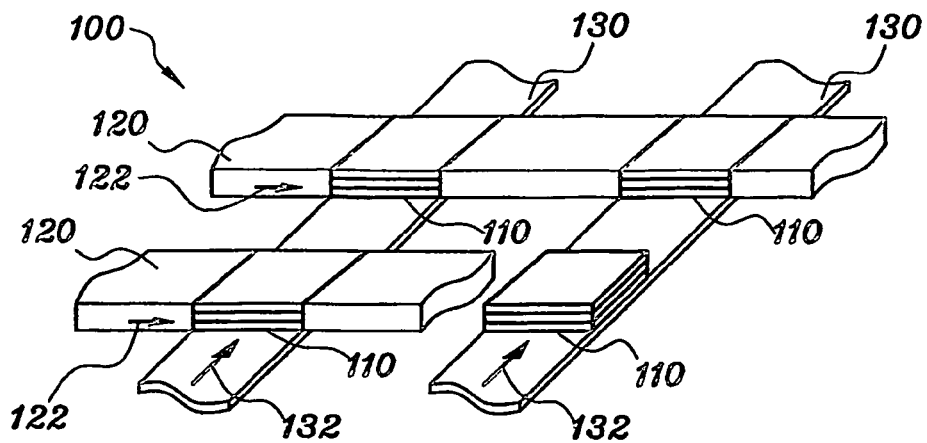
FIG. 1A is a partially enlarged perspective view showing a conventional spin-valve MRAM device.
Figure 1B:
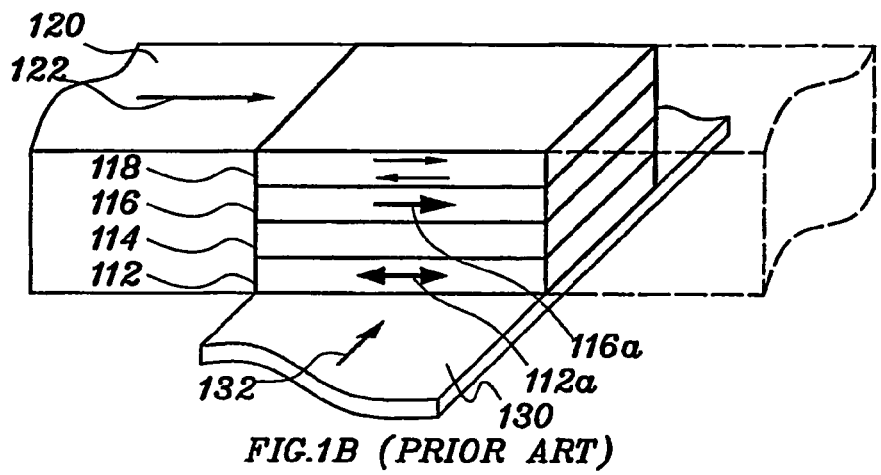
FIG. 1B is an enlarged view showing the a memory cell of the MRAM device shown in FIG. 1A.
Figure 2:
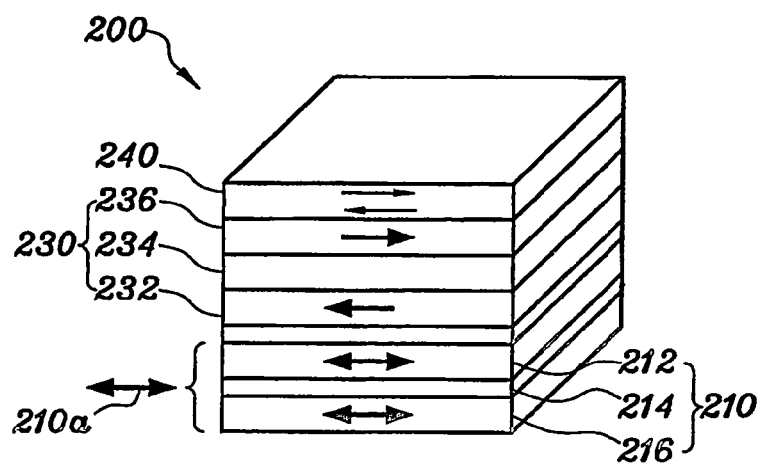
FIG. 2 is an enlarged view showing the a memory cell of another conventional spin-valve MRAM device.
Figure 3A:
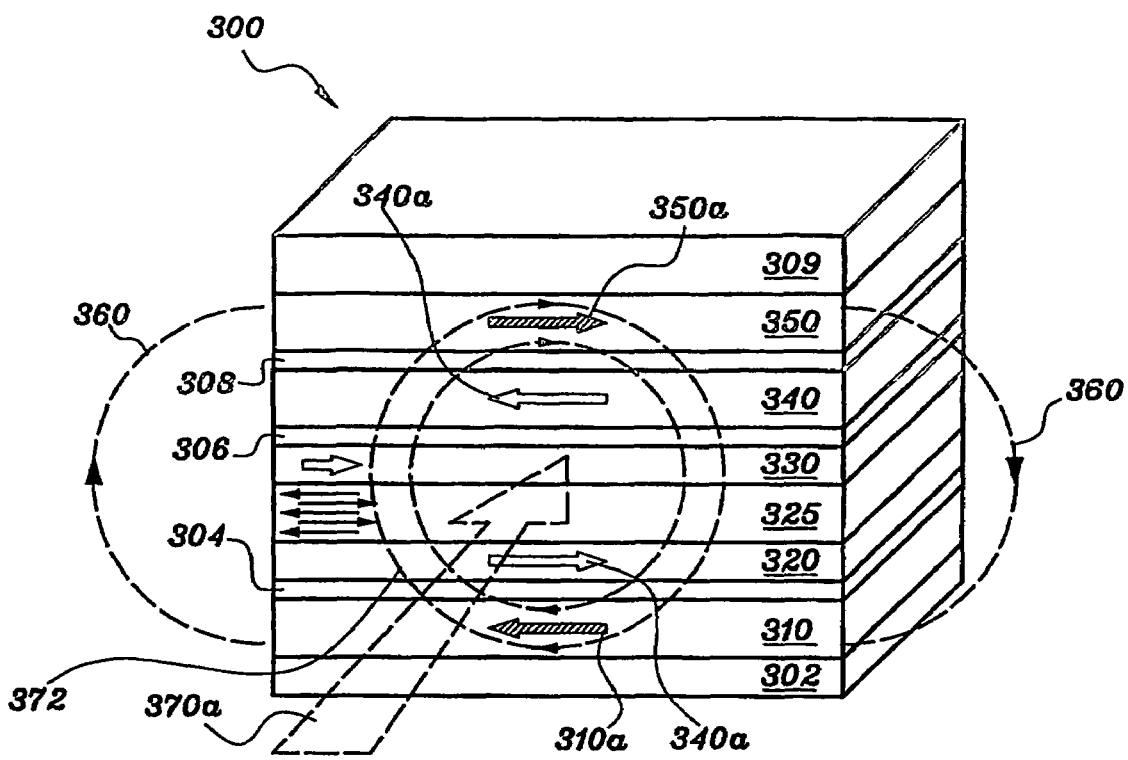
FIGS. 3A and 3B are enlarged perspective views showing a memory cell of a magnetic memory device according to one embodiment of the present invention.
Figure 3B:
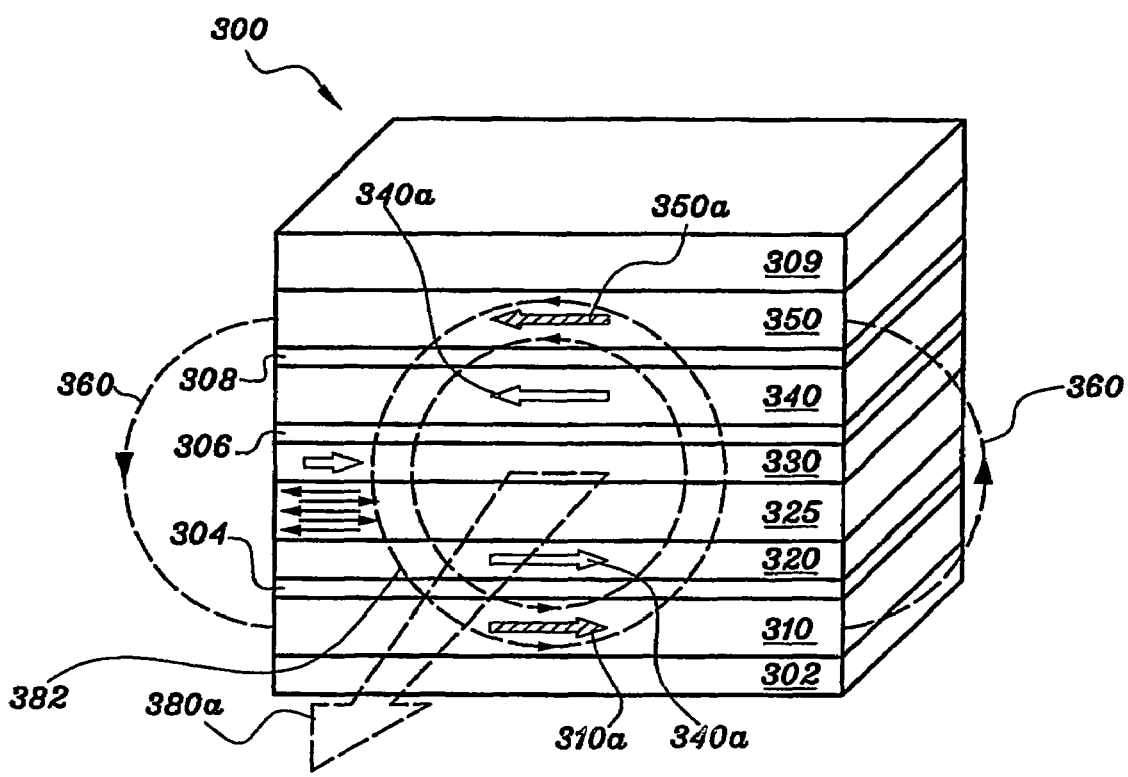

As shown in FIGS. 3A and 3B, a memory cell 300 for a magnetic memory device according to one embodiment of the present invention comprises a template layer 302, a first free layer 310, a first non-magnetic layer 304; a first ferromagnetic layer 320, an antiferromagnetic layer 325, a second ferromagnetic layer 330, a second non-magnetic layer 306, a third ferromagnetic layer 340, a third non-magnetic layer 308, a second free layer 350 and a cap layer 309. The above layers are disposed in sequence, and the first and third ferromagnetic layers 320 and 340 are disposed between the two free layers 310 and 350, as shown in FIG. 3A.

In this structure, the two ferromagnetic layers 320 and 340 serve as the pinned layer, and the two free layers 310 and 350 are the record layers with their initial magnetization anti-parallelly oriented. The two free layers 310 and 350 are magnetostatically coupled to each other to form a flux-closure 360.

In the embodiment shown in FIG. 3A, when an electric current pass through the memory cell 300 and in a direction 370a which is from the front side to the back side of the memory cell 300, a clockwise magnetic field 372 is generated. In response to the magnetic field 372, the magnetization vector 310a of the first free layer 310 points leftward, and the magnetization vector 350a of the third free layer 350 points rightward. The magnetization of the first free layer 310 is now anti-parallel to that of the first pinned layer 320, and the magnetization of the second free layer 350 is also anti-parallel to that of the third pinned layer 340. Therefore, the cell 300 is now in the "high" state.

As shown in FIG. 3B, when an electric current pass through the memory cell 300 and in a direction 380a coming from the back side to the front side, a counter clockwise magnetic field 382 is generated. In response to the magnetic field 382, the magnetization vector of the first free layer 310 will be changed by pointing rightward, and the magnetization vector of the second free layer 350 will point leftward. The magnetization of the first free layer 310 is now parallel to that of the first pinned layer 320, and the magnetization of the second free layer 350 is also parallel to that of the third pinned layer 340 and therefore, the cell 200 is now in the "low" state.

In this embodiment, the center portion of the memory cell is formed of lower electrical resistance material, and the border regions are formed of relatively higher electrical resistance material. Therefore, the electric current passing through the memory cell will have a majority portion passing through the center portion of the memory cell, hence to generate magnetic fields to apply to the free magnetic layers 310 and 350 located at the respective upper and lower border regions of the memory cell. By virtue of this positional configuration and the flux-closure 360, the switching of the magnetization of the two free layers 310 and 350 can be synergistically effected (i.e. switching of the magnetization of free layer 310 assists the switching of the magnetization of free layer 350, and vice versa), and the static magnetic field on the two free layers are reduced. Accordingly, the writing current can be lower than that used in a conventional memory device. Reduction of the writing current makes it possible to use only one electrical conductive line (e.g. the bit line) for performing both the writing and the reading operations.

As the two free layers 130 and 350 are magnetostatistically coupled through the flux closure 360, a further advantage can be obtained that an external magnetic field or a thermal fluctuation must be strong enough to switch both the two free layers to be parallel simultaneously and therefore, the memory device's resistance against external interference is increased, by which the stability is improved.

The term "external magnetic field" in this contexts refers to the magnetic field generated from a source outside the memory device, such as that caused by a thermal fluctuation. This term does not include the magnetic field generated by the bit line and/or the word line of the memory device for performing write/read operations.

Figure 4:
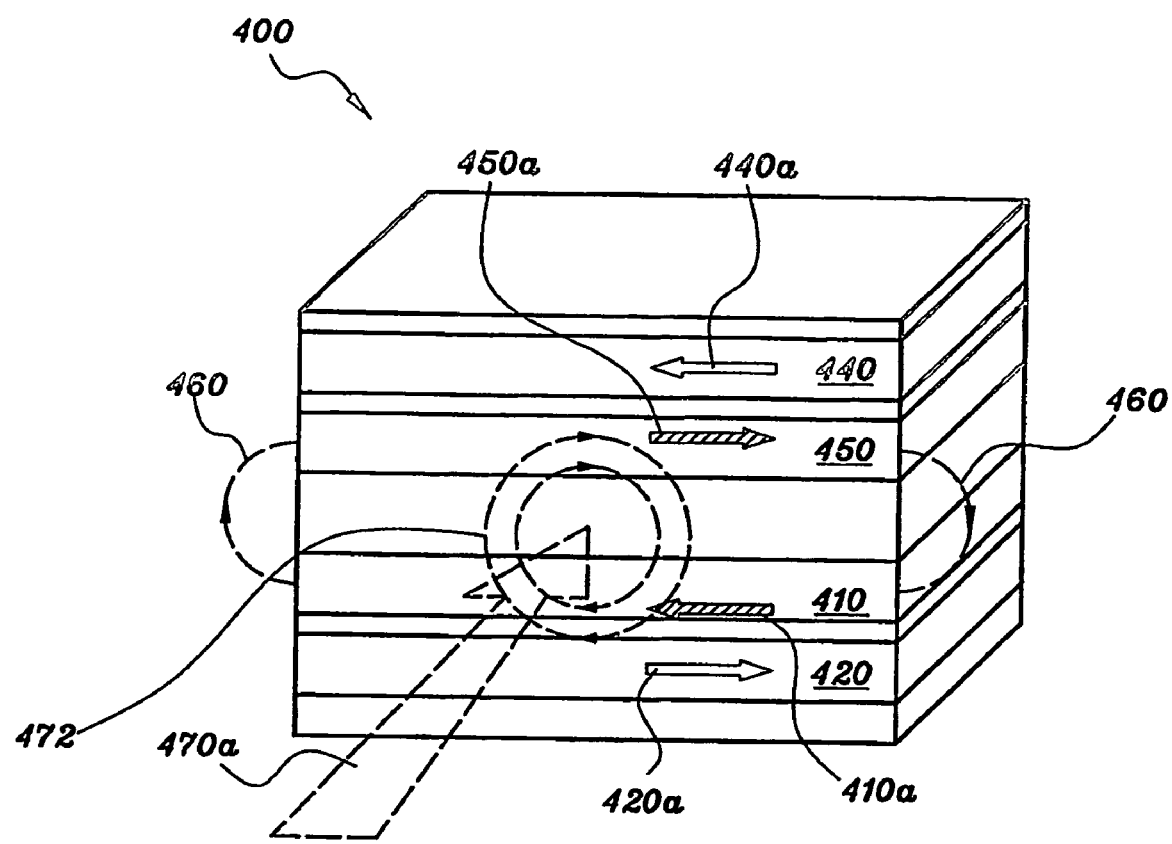
FIG. 4 is an enlarged perspective view showing a memory cell of a magnetic memory device according to another embodiment of the present invention.

FIG. 4 shows a memory cell 400 of a magnetic memory device according to another embodiment of the present invention. The memory cell 400 comprises two free layers 410 and 450 which are disposed between two ferromagnetic pinned layers 420 and 440. The two free layers 410 and 450 are magnetostatically and/or antiferromagnetically coupled to each other to form a flux-closure 460 to reduce the static magnetic field generated by the two pinned layers 420 and 440. During the writing process, when an electric current passes through the memory cell 400 in a direction 470a from the front side to the back side of the memory cell, a clockwise magnetic field 472 will be generated. In response to the magnetic field 472, the magnetization vector of the first free layer 410 will point leftward, and the magnetization vector of the second free layer 450 will point rightward.

At this point, the magnetization of the first free layer 410 is now anti-parallel to that of the first pinned layer 420, and the magnetization of the second free layer 450 is also anti-parallel to that of the third pinned layer 440 and therefore, the cell 400 is now in the "high" state. Similarly, an electric current may pass the bit line in the opposite direction so that to reverse the magnetization of the two free layers and change the cell 400 to its "low" state.

Figure 5A:
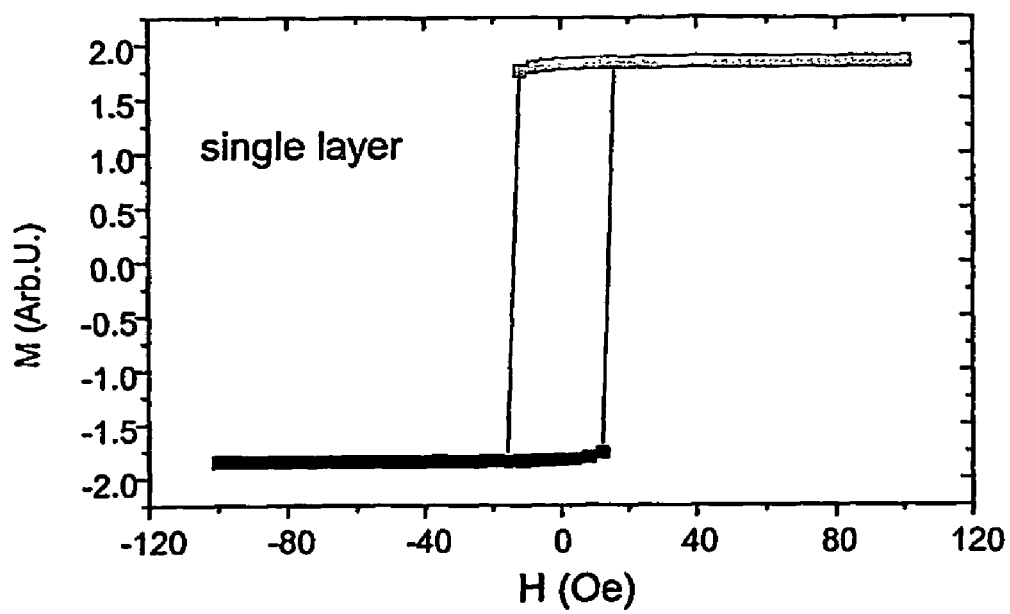
FIG. 5A is a graph showing a magnetization curve of a conventional memory device.

FIG. 5A shows a magnetization curve of a conventional magnetic memory device in presence of an external magnetic field. The X-axis represents the strength of the external magnetic field H (Oe), and the Y-axis represents the magnetic state M (arbitrary unit or A.U.). As shown in the figure, the conventional memory device changes its state (between the "high" and the "low") when external field reaches about 15 Oe.

Figure 5B:
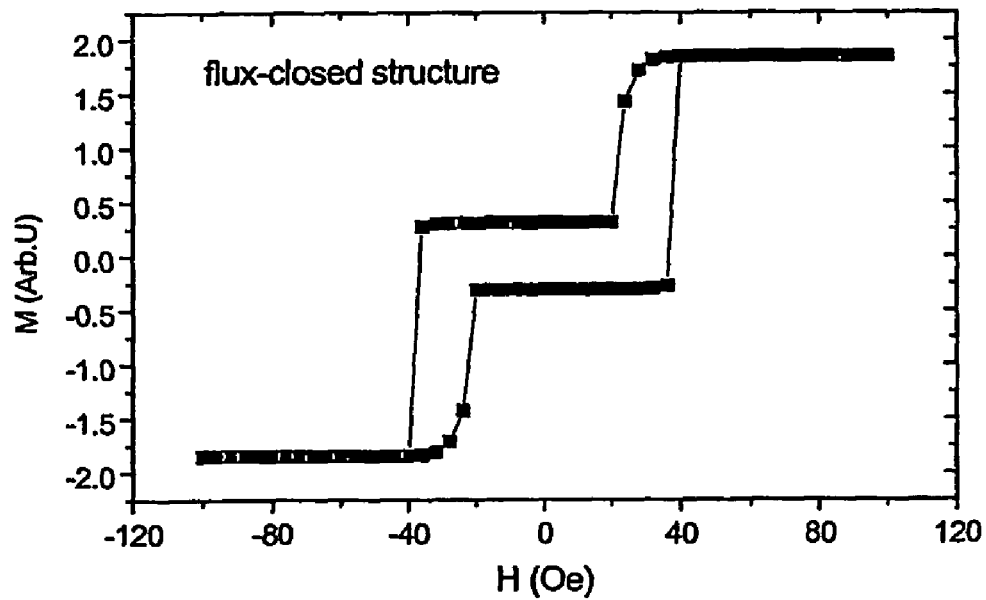
FIG. 5B is a graph showing a magnetization curve of a memory device according to one embodiment of the present invention.

FIG. 5B shows a magnetization curve of a magnetic memory device according to one embodiment of the present invention having a flux-closed structure. From the curve, the memory device according to one embodiment of the present invention will only change its state when external magnetic field is 40 Oe or higher. This indicates that the capability of a device according to the present invention against external field, such as a thermal fluctuation, is greatly increased over the conventional memory device. The increased switching field makes the memory device thermally more stable.

Figure 6A:
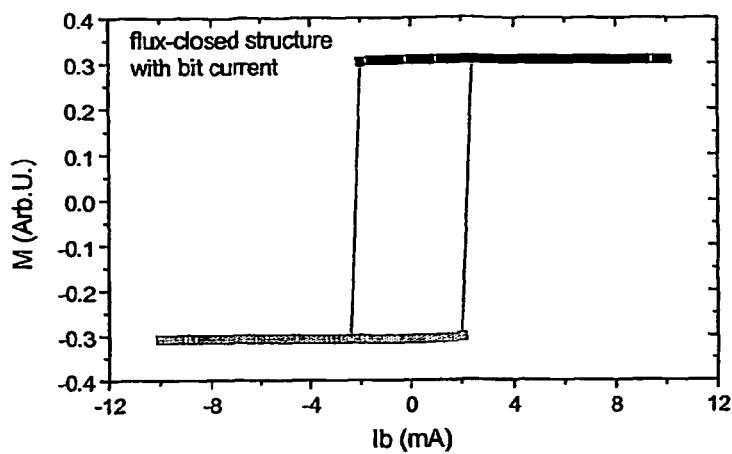
FIG. 6A is a graph showing a magnetization curve of a memory device having one bit line for both writing and reading operations according to one embodiment of the present invention.

FIG. 6A shows a magnetization curve of a magnetic memory device according to one embodiment of the present invention. The magnetic memory device includes only one electrical conductive line for performing both the writing and reading operations. The X-axis represents the writing current Ib (mA), where 1 mA writing current generates about 10 Oe magnetic field, and the Y-axis represents the magnetic state M (arbitrary unit or A.U.). FIG. 6A shows that the memory device switches its state when the writing current is about 2.5 mA or higher.

Figure 6B:
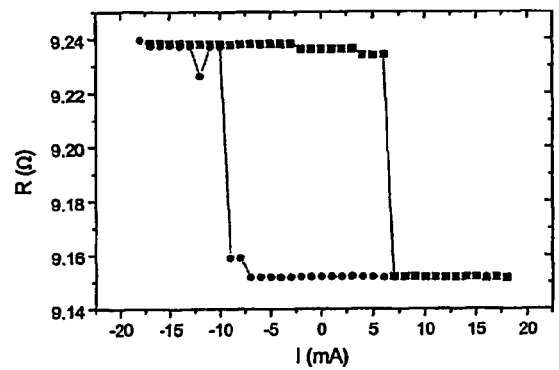
FIG. 6B is a graph showing an experimental result of a magnetoresistance curve of a memory device according to one embodiment of the present invention.

FIG. 6B shows an experimental result of a magnetoresistance curve of a magnetic memory device according to one embodiment of the present invention. The X-axis represents the writing current Ib (mA) and the Y-axis represents the magnetic resistance R (ohm or $\Omega$). FIG. 6B proves experimentally the feasibility of utilizing one electrical conductive line to perform both the writing operation and the reading operation for a magnetic memory device according to the present invention.

Figure 6C:
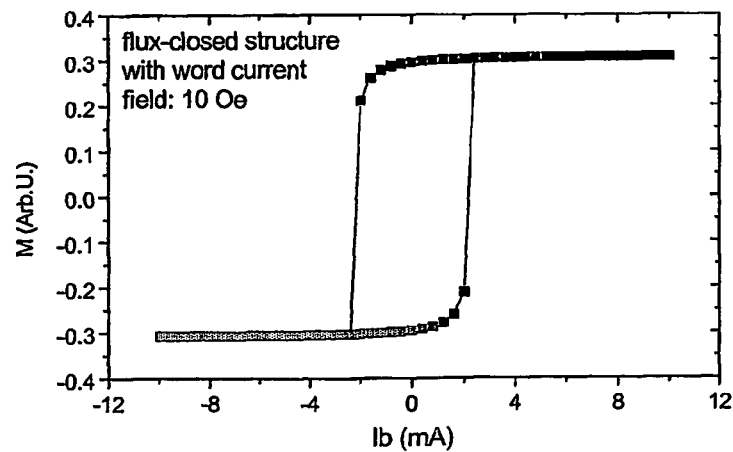
FIG. 6C is a graph showing a magnetization curve of a memory device having one bit line and one word line for writing and reading operations according to one embodiment of the present

FIG. 6C shows a magnetization curve of a magnetic memory device having both the bit lines and the word lines. According to this curve, the magnetic memory device switches its state when the writing current is about 2.5 mA or higher. Comparing with FIG. 6A, one would appreciate that when the writing current reaches the same level (i.e. 2.5 mA in this example), a magnetic memory device will switch its states with or without a word line.

It should be appreciated that according to the above curves, it is possible that a memory device requires only the bit line to perform its writing process. The word line of conventional magnetic memory may be eliminated and therefore the overall structure of the memory device is simplified and the writing current is reduced.

Figure 7A:
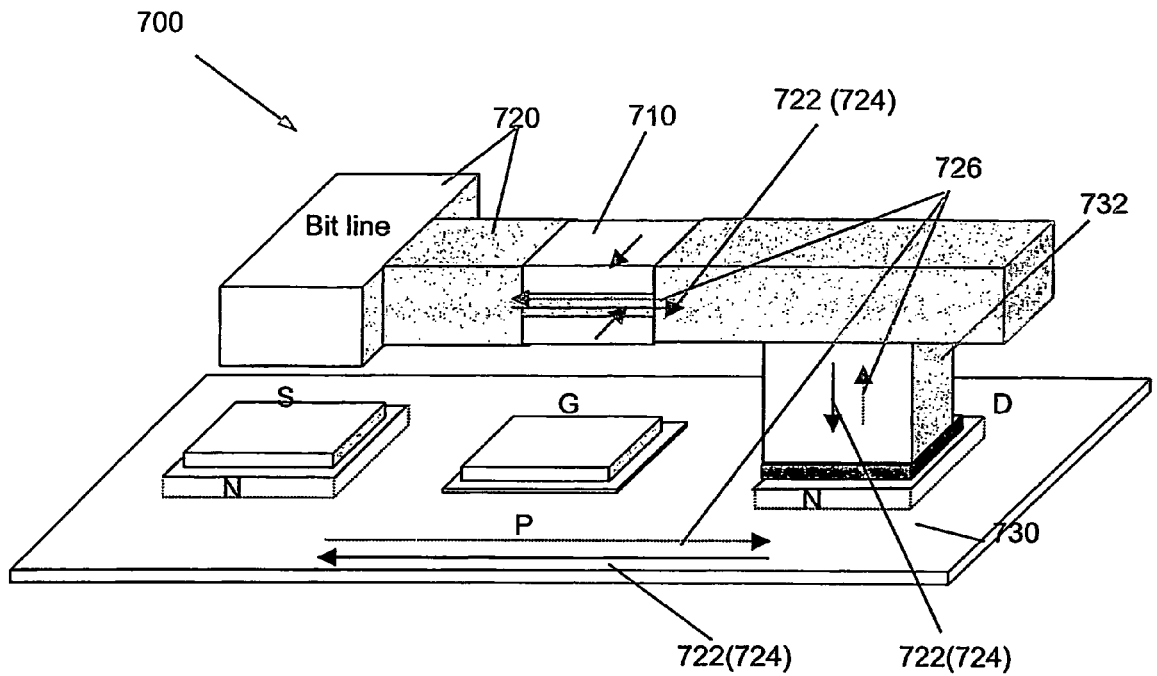
FIG. 7A is an enlarged partially perspective view showing the structure of a memory device according to one embodiment of the present invention.
Figure 7B:
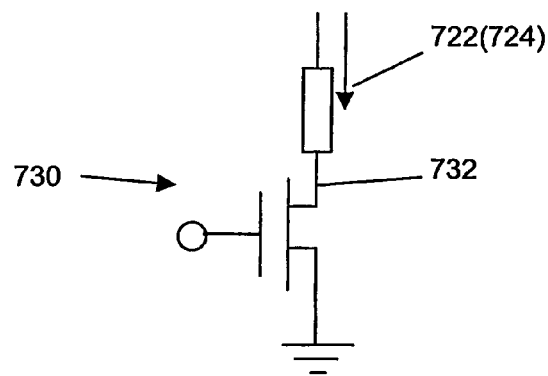
FIG. 7B is the circuit diagram of FIG. 7A.

Reference is now made to FIGS. 7A and 7B. A magnetic memory device 700 according to one embodiment of the present invention comprises a memory cell 710, a row of bit lines 720 electrically coupled to the memory cells 710 (only one memory cell is shown as an example for illustration). To perform the reading and writing operations, an array of gate elements such as switch transistors 730 (only one switch transistor is shown as an example for illustration) is provided with its collector 732 connected to the bit line 720.

During the reading process, the switch transistor 730 is set to "high" state so that a sense current 722 may pass through the bit line 720 and the memory cell 710 to read the voltage level of the memory cell 710. During the writing process, the switch transistor 730 is also set to "high" state so that either a positive write current 724 or a negative write current 726 may pass through the bit line 720 to alter the state of the memory cell 710 between the "1" and the "0" states to perform date recording thereon.

Figure 8:
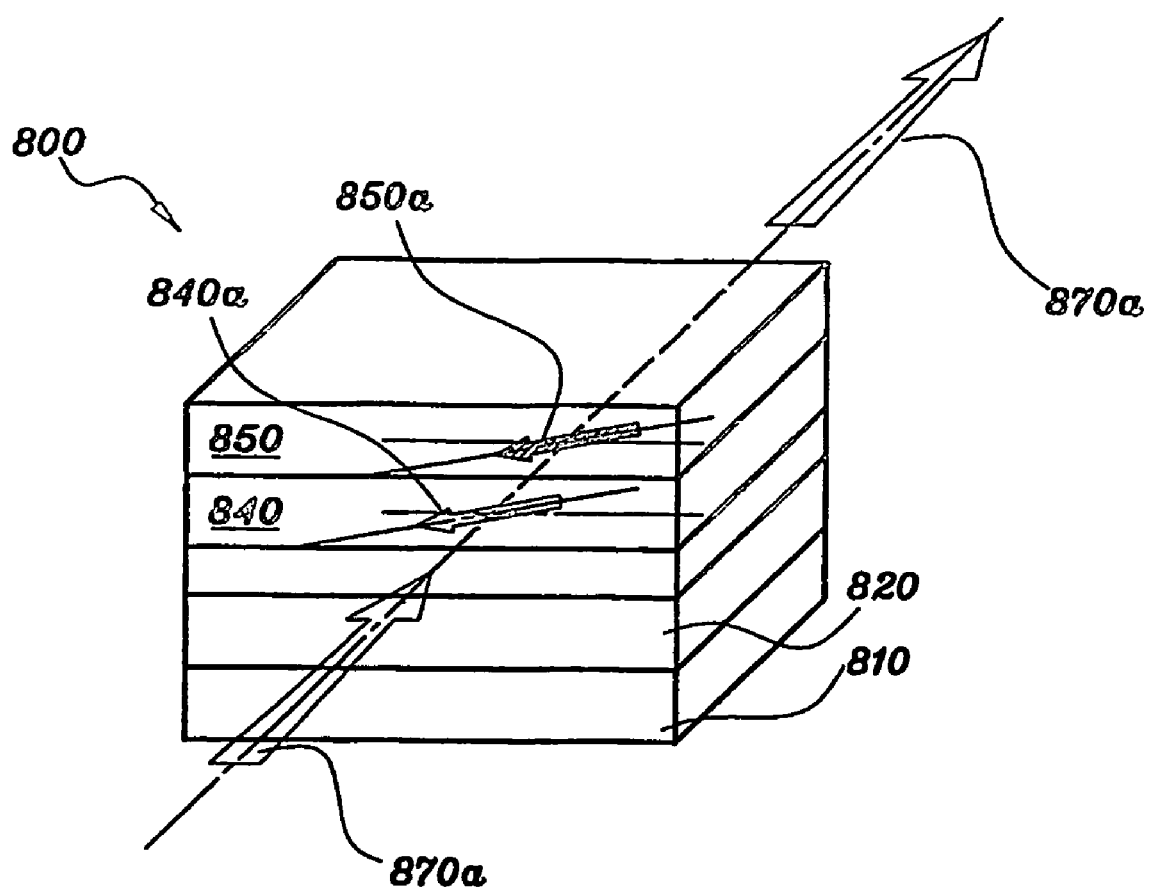
FIG. 8 is an enlarged perspective view showing a memory cell of a memory device according to a further embodiment of the present invention.

FIG. 8 shows a memory cell 800 for a memory device according to a further embodiment of the present invention. The memory cell comprises two anti-parallely aligned pinned layers 820 and 840 which are disposed between two free layers 810 and 850. An electric current may pass through the memory cell along a direction 870a. The two pinned layers 820 and 840 have magnetization vectors (such as magnetization vector 840a for the pinned layer 840.) fixed in a direction oblique to the direction 870a. The term "oblique" in this context refers to an orientation which is non-orthogonal to the direction 870a. The oblique-orientated magnetization vectors 820a and 840a of the two pinned layers 820 and 840 will cause the magnetization vectors 810a and 850a (only one magnetization vector 850a is shown in FIG. 8) aligned oblique to the direction 870a. In the writing operation, the oblique-oriented magnetization vectors 810a and 850a will be switched to a respective reverse directions in a manner easier than that perpendicularly-orientated, which assists in the writing current reduction in the writing operation.

The invention claimed is:

1. A memory cell for a magnetic memory device comprising:
   a first hard magnetic layer having a first fixed magnetization vector;
   a second hard magnetic layer having a second fixed magnetization vector,
   a first soft magnetic layer having a first alterable magnetization vector and disposed adjacent to the first hard magnetic layer, and
   a second soft magnetic layer having a second alterable magnetization vector and disposed adjacent to the second hard magnetic layer;
   wherein the first and the second soft magnetic layers are magnetostatically coupled antiparallel to each other to form a flux-closed structure.

2. The memory cell as recited in claim 1, wherein the first and the second soft magnetic layers are disposed between the first and the second hard magnetic layers.

3. The memory cell as recited in claim 1, wherein the first and the second hard magnetic layers are disposed between the first and the second soft magnetic layers.

4. The memory cell as recited in claim 1, further comprising an anti-ferromagnetic layer disposed adjacent to one of the first and the second hard magnetic layers to fix the orientation of the magnetization vector therein.

5. The memory cell as recited in claim 4, further comprising an assistant magnetic layer disposed adjacent to one of the first and the second hard magnetic layers, wherein the assistant magnetic layer having a magnetization vector anti-parallelly aligned with one of the first and the second hard magnetic layers to reduce the static magnetic field thereof.

6. The memory cell as recited in claim 1, further comprising an electrically conductive layer disposed between the first and the second soft magnetic layers for passing an electric current therethrough.

7. The memory cell as recited in claim 6, wherein the memory cell is adapted to allow passing of an electric current in a first direction and at least one of the magnetization vectors of the first and the second hard magnet layers is orientated along a second direction oblique to the first direction.

8. A magnetic memory device comprising a plurality of memory cells as claimed in claim 1.

9. The magnetic memory device as recited in claim 8, further comprising an electrically conductive line coupled to the plurality of memory cells.

10. The magnetic memory device as recited in claim 9, further comprising a plurality of gate members each coupled to the plurality of memory cells through the electrically conductive line for controllably supplying an electric current to the respective memory cell through the electrically conductive line.

11. The magnetic memory device as recited in claim 9, wherein the electrically conductive line is provided for performing both a writing operation and a reading operation.

12. A memory cell for a magnetic memory device comprising:
    a first hard magnetic layer having a first fixed magnetization vector,
    a second hard magnetic layer having a second magnetization vector;
    a first soft magnetic layer disposed adjacent to the first hard magnetic layer, the first soft magnetic layer having a first alterable magnetization vector; and
    a second soft magnetic layer disposed adjacent to the second hard magnetic layer, the second soft magnetic layer having a second alterable magnetization vector,
    wherein the memory cell is adapted to allow passing of an electric current in a first direction and at least one of the first fixed magnetization vector and the second fixed magnetization vector is oriented oblique with respect to the first direction of the electric current.

13. The memory cell as recited in claim 12, further comprising an electrically conductive layer disposed between the first and the second soft magnetic layers for allowing the electric current to pass through.

14. The memory cell as recited in claim 13, wherein the first and the second soft magnetic layers are magnetostatically coupled antiparallel to each other to form a flux-closed structure.

15. A magnetic memory device comprising a plurality of memory cells as recited in claim 12.

16. The magnetic memory device as recited in claim 15, further comprising an electrically conductive line coupled to the plurality of memory cells for passing an electric current therethrough.

17. The magnetic memory device as recited in claim 16, further comprising a plurality of gate members each coupled to the plurality of memory cells through the electrically conductive line for controllably passing an electric current to the respective memory cell through the electrically conductive line.

18. The magnetic memory device as recited in claim 15, wherein the electrically conductive line is provided for performing both a writing operation and a reading operation.

* * * * *